United States Patent
Shibata

(10) Patent No.: US 7,056,816 B2
(45) Date of Patent: Jun. 6, 2006

(54) METHOD FOR MANUFACTURING SEMICONDUCTOR DEVICE

(75) Inventor: Kiyoshi Shibata, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 143 days.

(21) Appl. No.: 10/920,360

(22) Filed: Aug. 18, 2004

(65) Prior Publication Data

US 2005/0070081 A1 Mar. 31, 2005

(30) Foreign Application Priority Data

Sep. 26, 2003 (JP) .............. 2003-335513

(51) Int. Cl.
*H01L 21/3205* (2006.01)
*H01L 21/4763* (2006.01)
*H01L 21/76* (2006.01)
*H01L 21/8238* (2006.01)
*H01L 21/336* (2006.01)

(52) U.S. Cl. .............. 438/589; 438/257; 438/206; 438/259; 438/451

(58) Field of Classification Search ........... 438/589, 438/206, 246, 257, 259, 451
See application file for complete search history.

(56) References Cited

U.S. PATENT DOCUMENTS

| 4,296,429 A | 10/1981 | Schroeder |
| 5,341,011 A | 8/1994 | Hshieh et al. |
| 6,170,815 B1 * | 1/2001 | Gil .............. 438/270 |
| 6,440,788 B1 * | 8/2002 | Mandelman et al. ....... 438/204 |
| 6,653,229 B1 * | 11/2003 | Cox .............. 438/637 |

FOREIGN PATENT DOCUMENTS

| JP | 06-151842 | 5/1994 |
| JP | 07-099310 | 4/1995 |

* cited by examiner

*Primary Examiner*—Chuong Anh Luu
(74) *Attorney, Agent, or Firm*—Leydig, Voit & Mayer, Ltd.

(57) ABSTRACT

A mask layer having an opening is formed on a semiconductor substrate. Next, oxygen ions and a first impurity are implanted into the semiconductor substrate using the mask layer as a mask. Then, the mask layer is removed. Next, the oxygen ions are heat treated to react and form an oxide film on the region where the first impurity has been implanted. Then, the oxide film is removed to form a depression in the semiconductor substrate. Next, a gate insulating film and a gate electrode are formed on the depression. Then a second impurity is implanted into the surface of the semiconductor substrate to form a source/drain. An impurity lighter than the oxygen ions and the second impurity is used as the first impurity.

20 Claims, 6 Drawing Sheets

METHOD FOR MANUFACTURING SEMICONDUCTOR DEVICE

BACKGROUND OF THE INVENTION

1. Field of the Invention

The present invention relates to a semiconductor device having an MOS transistor, and a method for manufacturing such a semiconductor device.

2. Background Art

Concurrent with the recent reduction of the gate-line width in semiconductor devices having MOS transistors, the channel length has also been reduced. This has brought about a problem that the threshold voltage of the transistor is significantly varied due to the narrow-channel effect.

In order to solve such a problem, there has been proposed a semiconductor device having a depression formed on the surface of a semiconductor substrate, and a gate insulating film and a gate electrode formed on the depression (e.g., Japanese Patent Laid-Open No. 7-99310). Thereby, a long channel length can be secured, and the narrow-channel effect caused by the reduction of the gate-line width can be suppressed.

In a conventional method for manufacturing such a semiconductor device, oxygen ions are selectively implanted in the surface of a semiconductor substrate, the oxygen ions are allowed to react by heat treatment to form an oxide film, and the oxide film is removed to form a depression.

In the conventional method, however, since oxygen ions must be implanted to the depth of the depression to be formed, the oxygen ions must be implanted at a high accelerating voltage. This causes a problem that damage also extends in lateral directions when oxygen ions are implanted. This problem is more serious when the depression is deeper than the source and drain.

SUMMARY OF THE INVENTION

The object of the present invention is to solve the above-described problems, and to provide a method for manufacturing a semiconductor device that can suppress the damage in forming the depression.

According to one aspect of the present invention, a mask layer having an opening is formed on a semiconductor substrate. Next, oxygen ions and a first impurity are implanted into the semiconductor substrate using the mask layer as a mask. Then, the mask layer is removed. Next, the oxygen ions are allowed to react by heat treatment to form an oxide film on the region wherein the first impurity has been implanted. Then, the oxide film is removed to form a depression in the semiconductor substrate. Next, a gate insulating film and a gate electrode are formed on the depression. Then a second impurity is implanted into the surface of the semiconductor substrate to form a source/drain. However, as the first impurity, an impurity lighter than the oxygen ions and the second impurity is used.

Other and further objects, features and advantages of the invention will appear more fully from the following description.

According to the present invention, since oxygen ions are not required to implant at a high accelerating voltage to form a depression, the damage in forming the depression can be suppressed.

DETAILED DESCRIPTION OF THE PREFERRED EMBODIMENTS

First Embodiment

FIGS. 1 and 2 show the method for manufacturing a semiconductor device according to the first embodiment of the present invention. First, as FIG. 1A shows, a silicon nitride film 12 of a thickness of 150 nm is formed as a mask on a silicon substrate 11, which is a semiconductor substrate, and is patterned using lithography and etching to form an opening 13. A photoresist may be used as the mask layer in place of the silicon nitride film 12.

Figure 1A:
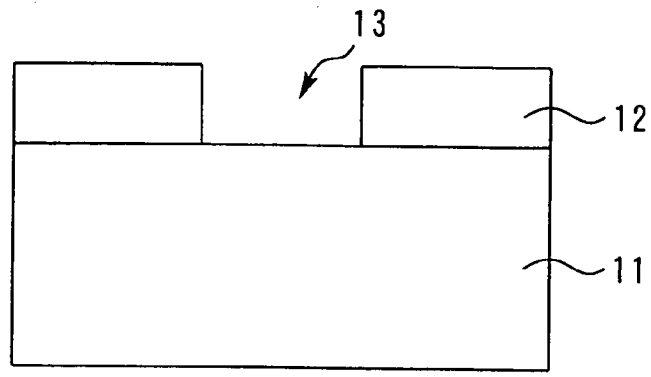
FIGS. 1A, 1B, 1C, 1D, 2A, 2B and 2C show the method for manufacturing a semiconductor device according to the first embodiment of the present invention.
Figure 1B:
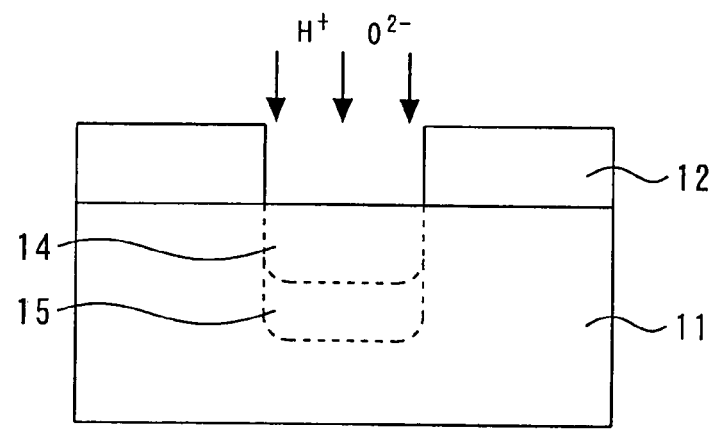

Next, as FIG. 1B shows, as a first impurity, hydrogen ions $H^+$ are implanted into the silicon substrate 11 at an accelerating voltage of 10 keV or below, e.g., 4.5 keV, using the silicon nitride film 12 as a mask. Thereafter, oxygen ions $O^{2-}$ are implanted into the silicon substrate 11 at an accelerating voltage of about 15 keV. As a first impurity, other impurities lighter than oxygen may also be used. However, in order not to adversely affect the transistor properties, the use of hydrogen or helium is preferable for a first impurity.

Figure 3:
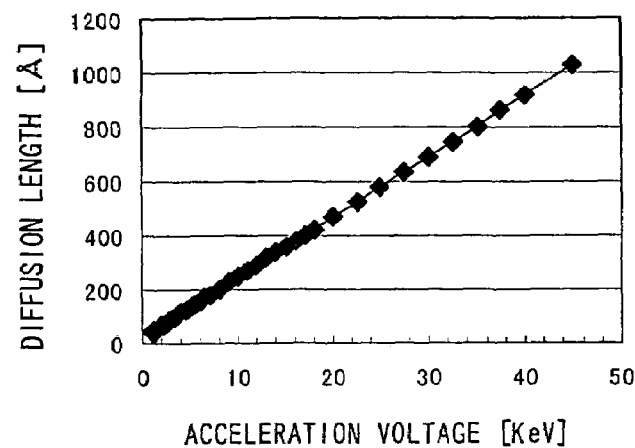
FIGS. 3, 4 and 5 are diagrams showing relationship between the accelerating voltage and the diffusion length in the vertical direction when oxygen, hydrogen and helium ions are implanted into a silicon substrate, respectively.
Figure 4:
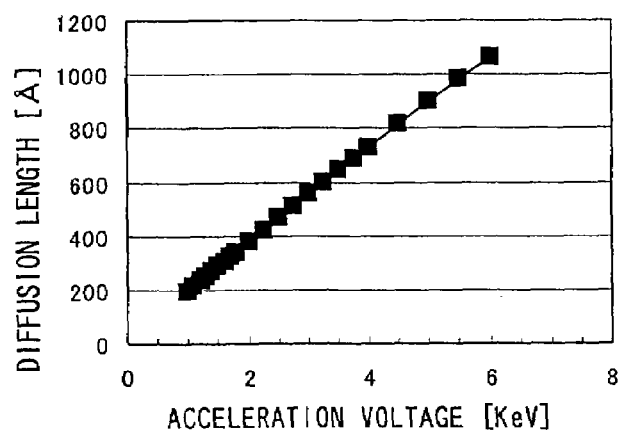
Figure 5:
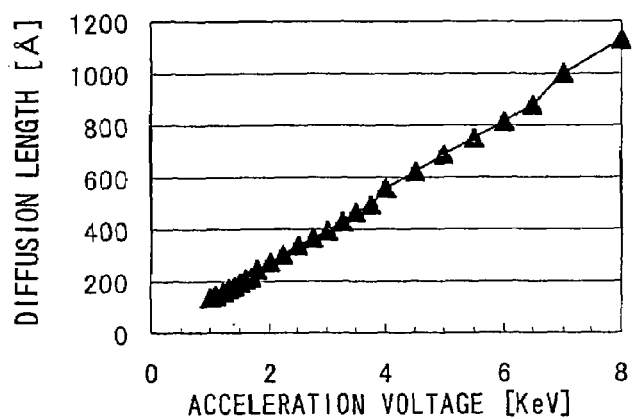

FIGS. 3, 4 and 5 are diagrams showing relationship between the accelerating voltage and the diffusion length in the vertical direction when oxygen, hydrogen and helium ions are implanted into a silicon. substrate, respectively. The depth of the region 15 wherein hydrogen ions are implanted at an accelerating voltage of 4.5 keV is about 80 nm; and the depth of the region 14 wherein oxygen ions are implanted at an accelerating voltage of 15 keV is about 40 nm. It can also be known that when helium is used in place of hydrogen, the depth of the implanted region of about 80 nm can be obtained employing an accelerating voltage of about 6 keV. The implantation rate of the hydrogen, helium and oxygen ions is $10^{16}$ atoms/cm$^2$.

Figure 1C:
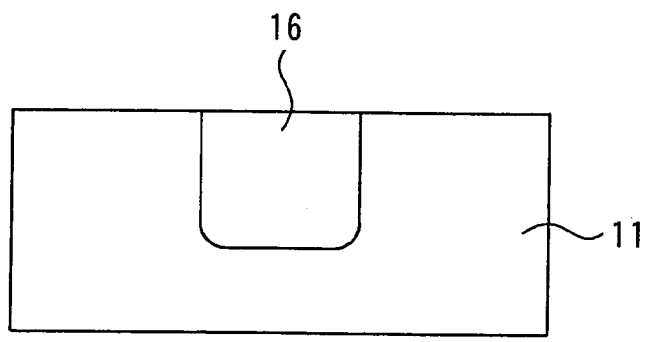

Next, as FIG. 1C shows, the silicon-nitride film 12 is removed using phosphoric acid. Then, oxygen ions are allowed to react by the heat treatment at 500 to 600° C. for several tens of minutes to several hours to form an oxide film 16 on the hydrogen-ion-implanted region of the silicon substrate 11. Here, the implantation of hydrogen ions accelerates the reaction rate of oxygen ions, and the silicon substrate 11 is oxidized to the location where hydrogen ions are implanted deeper than oxygen ions. Therefore the depth of the oxide film 16 becomes about 80 nm.

Figure 1D:
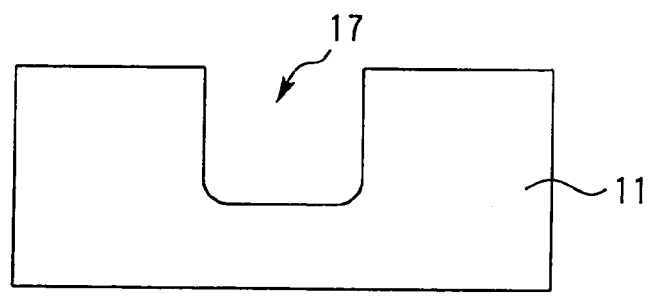

Next, as FIG. 1D shows, the oxide film 16 is removed using hydrofluoric acid to form a depression 17 on the surface of the silicon substrate 11. Further, an impurity is implanted into the surface of the silicon substrate 11 to form an active region.

Figure 2A:
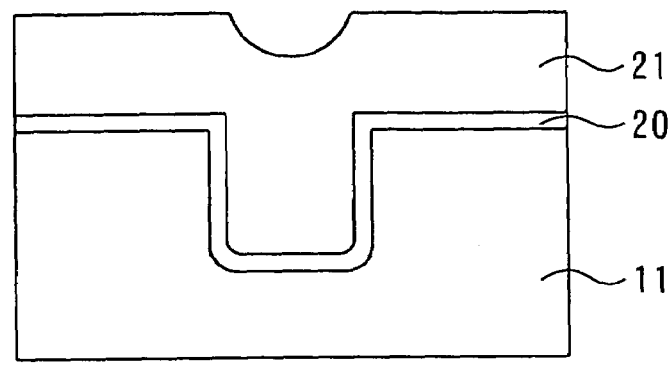

Next, as FIG. 2A shows, a silicon oxide film 20 of a thickness of 2 nm is formed by thermal oxidation on the entire surface of the silicon substrate 11. Then, a polysilicon film 21 of a thickness of 100 nm is formed on the silicon oxide film 20. However, in place of the silicon oxide film, a silicon oxynitride film, an alumina ($Al_2O_3$) film, a hafnia ($HfO_2$) film, or a composite film thereof can also be used. Polysilicon can be replaced by silicon germanium or tungsten.

Figure 2B:
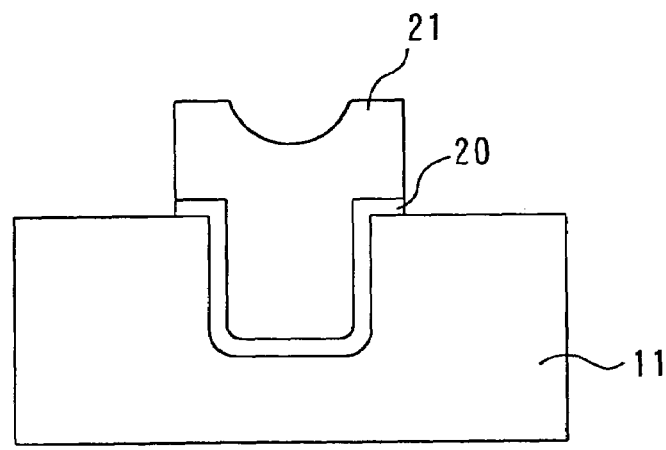
Figure 2C:
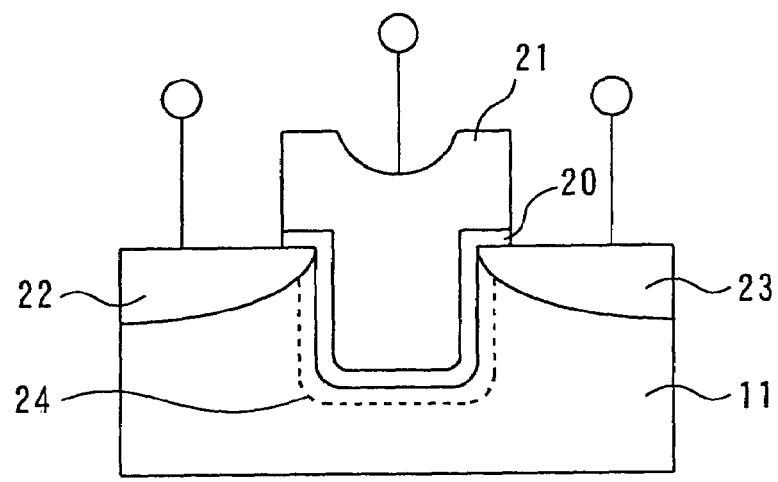

Then, as FIG. 2B shows, the silicon oxide film 20 and the polysilicon film 21 are patterned using lithography and etching to form a gate insulating film and a gate electrode are formed on the depression 17. Next, as FIG. 2C shows, As, P or the like is implanted into the surface of the silicon substrate 11 as a second impurity using the gate electrode as a mask, to form a source 22 and a drain 23 of depths of 40 to 50 nm.

Figure 6:
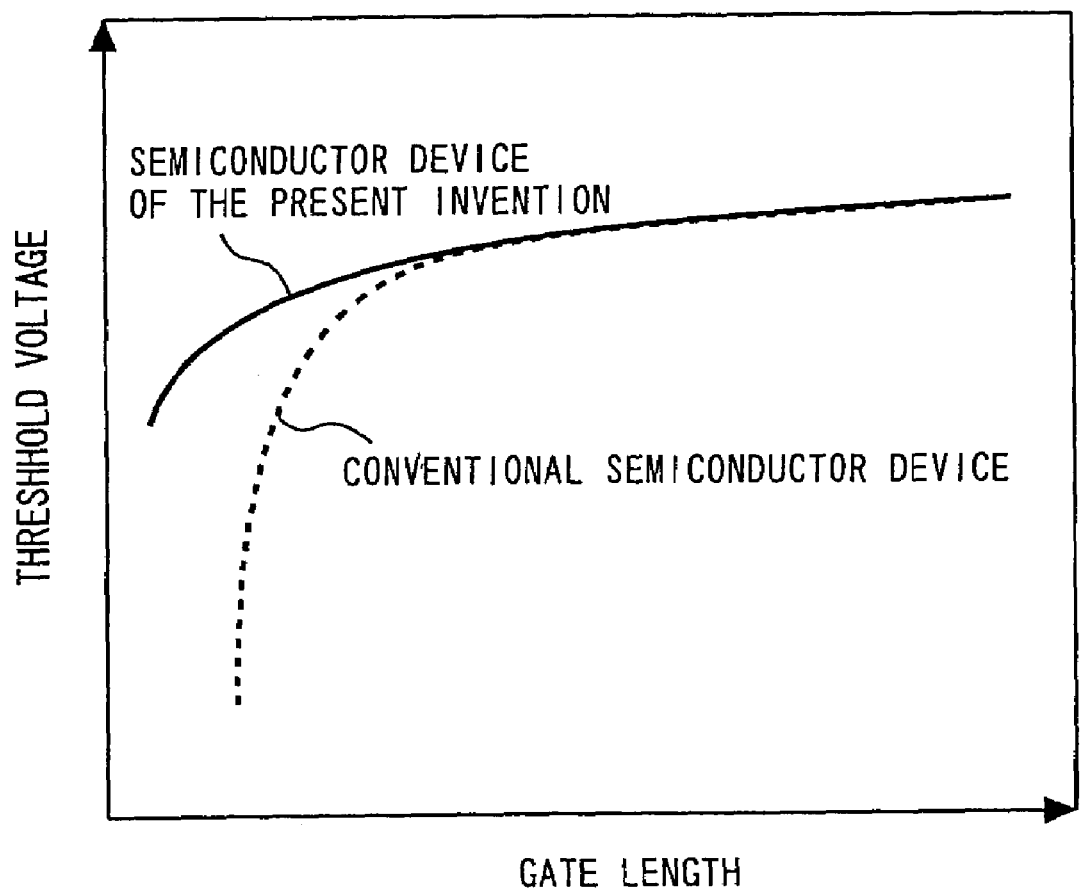
FIG. 6 shows the narrow-channel effect caused by the reduction of the gate-line width can be suppressed.

In the semiconductor device manufactured by the above steps, since the channel 24 of the transistor is formed along the internal surface of the depression deeper than the source and drain, it is ensured that the channel longer than conventional ones can be formed even having the same gate-line width. As a result, as FIG. 6 shows, the narrow-channel effect caused by the reduction of the gate-line width can be suppressed.

Since an impurity lighter than the oxygen ion and the second impurity is used as the first impurity, the first impurity can be implanted deeper than the source and drain at a low accelerating voltage.

According to the method for manufacturing a semiconductor device according to the first embodiment, as described above, since the oxygen ions are not required to implant at a high accelerating voltage to form the depression, damages in the formation of the depression can be suppressed.

Second Embodiment

Figure 7A:
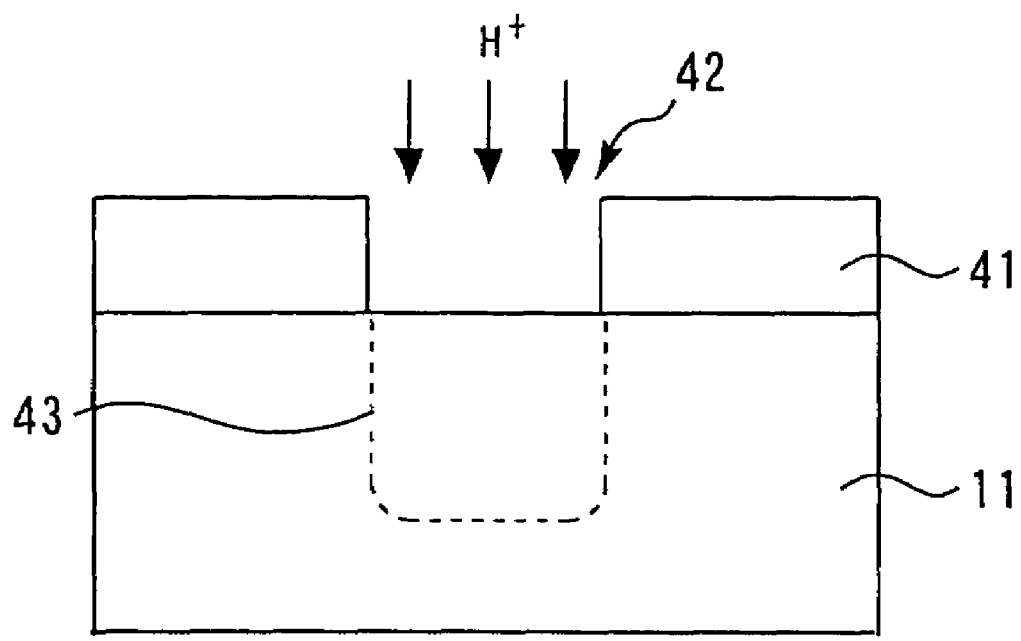
FIGS. 7A and 7B show a method for manufacturing a semiconductor device according to the second embodiment of the present invention.

FIG. 7 shows a method for manufacturing a semiconductor device according to the second embodiment of the present invention. First, as FIG. 7A shows, a silicon nitride film 41 of a thickness of 150 nm is formed on a silicon substrate 11 as a first mask layer, and patterned using lithography and etching to form a first opening 42. Next, as a first impurity, hydrogen ions $H^+$ are implanted into the silicon substrate 11 at an accelerating voltage of 10 keV or below, e.g., 6 keV, using the silicon nitride film 41 as a mask. Thereby, the depth of the hydrogen-ion-implanted region 43 becomes about 80 nm.

Figure 7B:
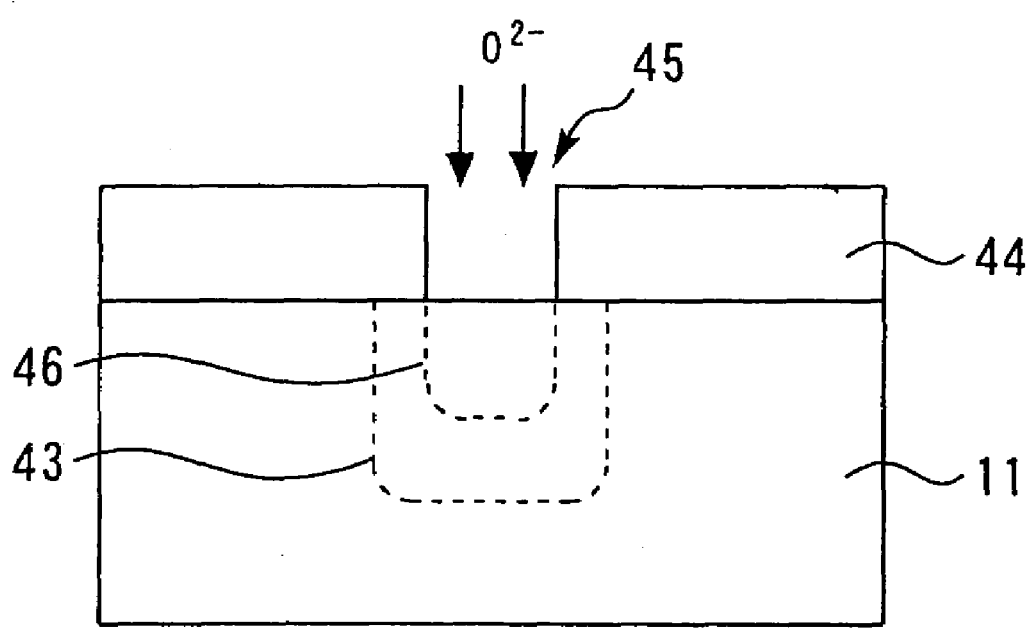

Next, FIG. 7B shows, after removing the silicon nitride film 41, a silicon nitride film 44 of a thickness of 150 nm is formed on a silicon substrate 11 as a second mask layer, and patterned using lithography and etching to form a second opening 45. The second opening 45 is in the region where the first opening 42 was formed, and the opening width of the second opening 45 is smaller than the opening width of the first opening 42.

Next, oxygen ions $O^{2-}$ are implanted at about 15 keV into the silicon substrate 11 using the silicon nitride film 44 as a mask. Thereby, the depth of the region 46 wherein the oxygen ions are implanted becomes about 40 nm. The implantation rate of the hydrogen and oxygen ions is $10^{16}$ atoms/$cm^2$. After removing the silicon nitride film 44, steps after the step shown in FIG. 1C are carried out.

In the method for manufacturing a semiconductor device according to the second embodiment of the present invention, as described above, a second mask layer having a second opening smaller than the first opening is formed as a mask used in the implantation of oxygen ions, in the region wherein the first opening was formed. Thereby, the diffusion of oxygen ions in the lateral directions when the oxide film is formed by heat treatment can be positively utilized.

It is preferred that the second opening 45 is formed inside the first opening 42 by the length of diffusion in the lateral directions in the implantation of oxygen ions, and the length of diffusion in the lateral directions due to heat treatment. However, the minimum width of the second opening 45 is determined by the process performance.

Figure 8:
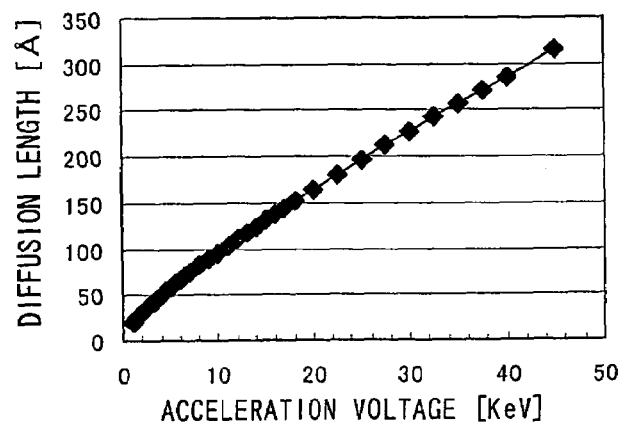
FIG. 8 is a graph showing the relationship between the accelerating voltage and the diffusion length in the lateral direction when oxygen ions are implanted into a silicon substrate.

FIG. 8 is a graph showing the relationship between the accelerating voltage and the diffusion length in the lateral direction when oxygen ions are implanted into a silicon substrate. It can be known from FIG. 8 that, for example, when oxygen ions are implanted into the silicon substrate at an accelerating voltage of 15 keV, the oxygen ions are diffused laterally for about 13 nm from FIG. 8. When heat treatment is performed at 500° C., the oxygen ions are diffused for further several nanometers. In this case, therefore, it is preferred that the width of the second opening 45 is formed about 20 nm inside the one side edge of the first opening 42.

Figure 9:
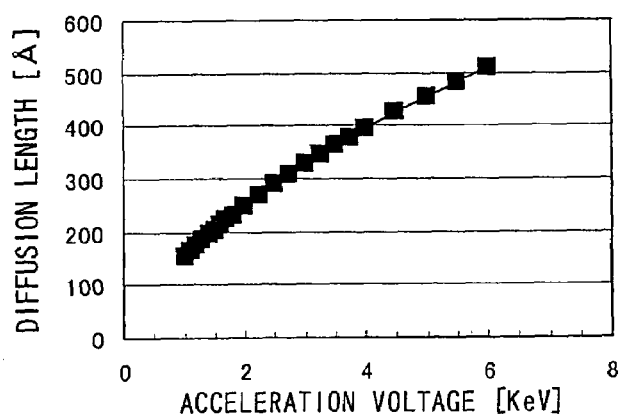
FIGS. 9 and 10 are graphs showing the relationship between the accelerating voltage and the diffusion length in the lateral direction when hydrogen ions and helium ions are implanted into a silicon substrate, respectively.
Figure 10:
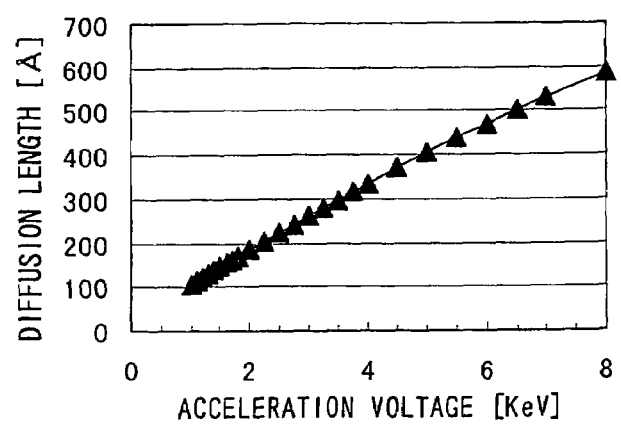

FIGS. 9 and 10 are graphs showing the relationship between the accelerating voltage and the diffusion length in the lateral direction when hydrogen ions and helium ions are implanted into a silicon substrate, respectively. In order to form the depression of a desired width, the lateral diffusion of hydrogen or helium, which is the first impurity, must also be considered.

Third Embodiment

In the method for manufacturing a semiconductor device according to the third embodiment of the present invention, different from the first embodiment, no oxygen ions are implanted into a semiconductor substrate, but only hydrogen or helium ions are implanted as a first impurity. Then, heat treatment is performed in an oxygen-containing atmosphere to form an oxide film on the region wherein the first impurity has been implanted. Other constitutions are same as those in the first embodiment. Thereby, the step for implanting oxygen ions carried out in the first embodiment can be omitted.

Fourth Embodiment

In the method for manufacturing a semiconductor device according to the fourth embodiment of the present invention, different from the first embodiment, no oxygen ions are implanted into a semiconductor substrate, but only hydrogen or helium ions are implanted as a first impurity. Then, the region wherein the first impurity has been implanted is removed using hydrofluoric acid. The region wherein amorphous silicon has been formed by the implantation of the first impurity, or the region wherein the bonds of silicon atoms have been broken, has a certain etching rate against hydrofluoric acid. Thereby, a depression can be formed in the semiconductor substrate. Other constitutions are same as those in the first embodiment. Thereby, the step of heat treatment in an oxygen atmosphere carried out in the second embodiment can be omitted.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2003-335513, filed on Sep. 26, 2003 including specification, claims, drawings and summary, on which the Convention priority of the present application is based, are incorporated herein by reference in its entirety.

What is claimed is:

1. A method for manufacturing a semiconductor device comprising:
   forming a mask layer having an opening on a semiconductor substrate;
   implanting oxygen ions and a first impurity into the semiconductor substrate using the mask layer as a mask;
   removing the mask layer;
   heat treating so the oxygen ions react to form an oxide film on the region where the first impurity is implanted;
   removing the oxide film to form a depression in the semiconductor substrate;
   forming a gate insulating film and a gate electrode on the depression; and
   implanting a second impurity into the surface of the semiconductor substrate to form source/drain regions, wherein an impurity lighter than the oxygen ions and the second impurity is used as the first impurity.

2. The method for manufacturing a semiconductor device according to claim 1, wherein one of hydrogen and helium is used as the first impurity.

3. The method for manufacturing a semiconductor device according to claim 1, including forming the depression to be deeper than the source/drain regions.

4. The method for manufacturing a semiconductor device according to claim 1, including implanting the first impurity at an accelerating voltage not exceeding 10 keV.

5. The method for manufacturing a semiconductor device according to claim 1, including removing the oxide film with hydrofluoric acid.

6. A method for manufacturing a semiconductor device comprising:
   forming a first mask layer having a first opening on a semiconductor substrate;
   implanting a first impurity into the semiconductor substrate using the first mask layer as a mask;
   removing the first mask layer;
   forming a second mask layer having a second opening smaller than the first opening, in the region where the first opening was located, on the semiconductor substrate;
   implanting oxygen ions into the semiconductor substrate using the second mask layer as a mask;
   removing the second mask layer;
   heat treating so the oxygen ions react to form an oxide film on the region where the first impurity is implanted;
   removing the oxide film to form a depression in the semiconductor substrate;
   forming a gate insulating film and a gate electrode on the depression; and
   implanting a second impurity into the surface of the semiconductor substrate to form source/drain regions, wherein an impurity lighter than the oxygen ions and the second impurity is used as the first impurity.

7. The method for manufacturing a semiconductor device according to claim 6, wherein one of hydrogen and helium is used as the first impurity.

8. The method for manufacturing a semiconductor device according to claim 6, including forming the depression to be deeper than the source/drain regions.

9. The method for manufacturing a semiconductor device according to claim 6, including implanting the first impurity at an accelerating voltage not exceeding 10 keV.

10. The method for manufacturing a semiconductor device according to claim 6, including removing the oxide film with hydrofluoric acid.

11. A method for manufacturing a semiconductor device comprising:
    forming a mask layer having an opening on a semiconductor substrate;
    implanting a first impurity into the semiconductor substrate using the mask layer as a mask;
    removing the mask layer;
    heat treating in an oxygen-containing atmosphere to form an oxide film on the region where the first impurity is implanted;
    removing the oxide film to form a depression in the semiconductor substrate;
    forming a gate insulating film and a gate electrode on the depression; and
    implanting a second impurity into the surface of the semiconductor substrate to form source/drain regions, wherein an impurity lighter than the oxygen ions and the second impurity is used as the first impurity.

12. The method for manufacturing a semiconductor device according to claim 11, wherein one of hydrogen and helium is used as the first impurity.

13. The method for manufacturing a semiconductor device according to claim 11, including forming the depression to be deeper than the source/drain regions.

14. The method for manufacturing a semiconductor device according to claim 11, including implanting the first impurity at an accelerating voltage not exceeding 10 keV.

15. The method for manufacturing a semiconductor device according to claim 11, including removing the oxide film with hydrofluoric acid.

16. A method for manufacturing a semiconductor device comprising:
    forming a mask layer having an opening on a semiconductor substrate;
    implanting a first impurity into the semiconductor substrate using the mask layer as a mask;
    removing the mask layer;
    removing the region where the first impurity was implanted to form a depression in the semiconductor substrate;
    forming a gate insulating film and a gate electrode on the depression; and
    implanting a second impurity into the surface of the semiconductor substrate to form source/drain regions, wherein an impurity lighter than the second impurity is used as the first impurity.

17. The method for manufacturing a semiconductor device according to claim 16, wherein one of hydrogen and helium is used as the first impurity.

18. The method for manufacturing a semiconductor device according to claim 16, including forming the depression to be deeper than the source/drain regions.

19. The method for manufacturing a semiconductor device according to claim 16, including implanting the first impurity at an accelerating voltage not exceeding 10 keV.

20. The method for manufacturing a semiconductor device according to claim 16, including using hydrofluoric acid to remove the region where the first impurity was implanted.

* * * * *